United States Patent
Allegato et al.

(10) Patent No.: US 11,128,958 B2
(45) Date of Patent: Sep. 21, 2021

(54) METHOD FOR MANUFACTURING A SEMICONDUCTOR DIE PROVIDED WITH A FILTERING MODULE, SEMICONDUCTOR DIE INCLUDING THE FILTERING MODULE, PACKAGE HOUSING THE SEMICONDUCTOR DIE, AND ELECTRONIC SYSTEM

(71) Applicant: STMICROELECTRONICS S.R.L., Agrate Brianza (IT)

(72) Inventors: Giorgio Allegato, Monza (IT); Federico Vercesi, Milan (IT); Laura Maria Castoldi, Milan (IT); Laura Oggioni, Milan (IT); Matteo Perletti, Boltiere (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 111 days.

(21) Appl. No.: 16/256,816

(22) Filed: Jan. 24, 2019

(65) Prior Publication Data
US 2019/0239000 A1     Aug. 1, 2019

(30) Foreign Application Priority Data
Jan. 26, 2018 (IT) .......................... 102018000002049

(51) Int. Cl.
*H04R 19/04*     (2006.01)
*B81C 1/00*     (2006.01)
(Continued)

(52) U.S. Cl.
CPC ......... *H04R 19/04* (2013.01); *B81C 1/00309* (2013.01); *H04R 1/021* (2013.01);
(Continued)

(58) Field of Classification Search
CPC combination set(s) only.
See application file for complete search history.

(56) References Cited

U.S. PATENT DOCUMENTS 6,368,903 B1 *   4/2002   Bryant .............. H01L 29/66757
                                                                        257/E21.413
8,685,198 B2     4/2014   Mietta et al.
(Continued)

FOREIGN PATENT DOCUMENTS

CN     206341428 U     7/2017
EP     2561131 B1     6/2014
(Continued)

*Primary Examiner* — Fan S Tsang
*Assistant Examiner* — Angelica M McKinney
(74) *Attorney, Agent, or Firm* — Seed IP Law Group LLP

(57) ABSTRACT

A method for manufacturing a semiconductor die, comprising the steps of: providing a MEMS device having a structural body, provided with a cavity, and a membrane structure suspended over the cavity; coupling the structural body to a filtering module via direct bonding or fusion bonding so that a first portion of the filtering module extends over the cavity and a second portion of the filtering module extends seamlessly as a prolongation of the structural body; and etching selective portions of the filtering module in an area corresponding to the first portion, to form filtering openings fluidically coupled to the cavity. The semiconductor die is, for example, a microphone.

19 Claims, 8 Drawing Sheets

(51) Int. Cl.
  *H04R 1/08* (2006.01)
  *H04R 19/00* (2006.01)
  *H04R 1/02* (2006.01)
  *H04R 31/00* (2006.01)

(52) U.S. Cl.
  CPC ........... *H04R 1/086* (2013.01); *H04R 19/005* (2013.01); *H04R 31/00* (2013.01); *B81C 2201/0133* (2013.01); *H04R 2201/003* (2013.01)

(56) References Cited

U.S. PATENT DOCUMENTS

| | | | |
|---|---|---|---|
| 9,438,972 B2 * | 9/2016 | Wang | H04R 7/04 |
| 9,769,554 B2 | 9/2017 | Brioschi et al. | |
| 9,992,563 B2 | 6/2018 | Zhang et al. | |
| 10,149,032 B2 * | 12/2018 | Agashe | B81B 7/0061 |
| 10,654,712 B2 * | 5/2020 | Albers | B81C 1/00158 |
| 10,773,950 B2 * | 9/2020 | Zou | H04R 19/04 |
| 2004/0027671 A1 | 2/2004 | Wu et al. | |
| 2005/0085369 A1 | 4/2005 | Jensen | |
| 2005/0226784 A1 | 10/2005 | Kobayashi | |
| 2006/0254851 A1 | 11/2006 | Karamuk | |
| 2009/0101505 A1 | 4/2009 | Marino et al. | |
| 2009/0169035 A1 | 7/2009 | Rombach et al. | |
| 2010/0040250 A1 | 2/2010 | Gebert | |
| 2010/0183181 A1 | 7/2010 | Wang | |
| 2010/0246877 A1 | 9/2010 | Wang et al. | |
| 2010/0284553 A1 | 11/2010 | Conti et al. | |
| 2011/0274299 A1 | 11/2011 | Shaw et al. | |
| 2012/0148083 A1 | 6/2012 | Knauss et al. | |
| 2012/0237073 A1 * | 9/2012 | Goida | H04R 1/02 381/361 |
| 2012/0280335 A1 | 11/2012 | Zoellin et al. | |
| 2013/0129133 A1 | 5/2013 | Inoda et al. | |
| 2013/0210188 A1 * | 8/2013 | Wang | G01B 11/14 438/73 |
| 2014/0044297 A1 * | 2/2014 | Loeppert | H04R 1/08 381/355 |
| 2014/0064542 A1 * | 3/2014 | Bright | H04R 1/086 381/359 |
| 2014/0140558 A1 | 5/2014 | Kwong | |
| 2014/0169607 A1 | 6/2014 | Goida et al. | |
| 2015/0041930 A1 | 2/2015 | Kim et al. | |
| 2015/0264463 A1 | 9/2015 | Kuzuyama et al. | |
| 2015/0273524 A1 * | 10/2015 | Ely | G10K 9/22 310/322 |
| 2016/0024290 A1 | 1/2016 | Yamaguchi | |
| 2016/0261941 A1 * | 9/2016 | Brioschi | H04R 19/04 |
| 2016/0277844 A1 * | 9/2016 | Kopetz | H04R 19/005 |
| 2017/0006368 A1 | 1/2017 | Brioschi et al. | |
| 2018/0036669 A1 | 2/2018 | Canonico et al. | |
| 2018/0115811 A1 * | 4/2018 | Zhang | H04R 1/086 |
| 2018/0202982 A1 * | 7/2018 | Fain | G01N 30/66 |
| 2018/0215609 A1 * | 8/2018 | Agashe | B81C 1/00285 |
| 2020/0137501 A1 * | 4/2020 | Piechocinski | B81B 7/0064 |

FOREIGN PATENT DOCUMENTS

| | | |
|---|---|---|
| WO | 2010/124899 A1 | 11/2010 |
| WO | 2011/132062 A1 | 10/2011 |
| WO | 2013/097135 A1 | 7/2013 |
| WO | 2014/142237 A1 | 9/2014 |

\* cited by examiner (Known Art)

(Known Art)

METHOD FOR MANUFACTURING A SEMICONDUCTOR DIE PROVIDED WITH A FILTERING MODULE, SEMICONDUCTOR DIE INCLUDING THE FILTERING MODULE, PACKAGE HOUSING THE SEMICONDUCTOR DIE, AND ELECTRONIC SYSTEM

BACKGROUND

Technical Field

The present disclosure relates to a method for manufacturing a semiconductor die including a filtering module, a semiconductor die including a filtering module, a package housing the semiconductor die, and an electronic system housing the package.

Description of the Related Art

In a known way, an acoustic transducer (in particular, a microphone) of a MEMS (Micro-Electro-Mechanical System) type comprises a membrane sensitive structure designed to transduce acoustic pressure waves (sound waves) into an electrical quantity (for example, a capacitive variation), and a reading electronics designed to perform appropriate processing operations (amongst which amplification and filtering operations) on said electrical quantity so as to supply an electrical output signal (for example, a voltage) representing the acoustic pressure wave received. In the case where the MEMS sensitive structure uses a capacitive sensing principle, it comprises, in general, a mobile electrode, obtained as a diaphragm or a membrane, arranged facing a fixed electrode, to provide the plates of a sensing capacitor with variable capacitance. The mobile electrode is anchored by a first portion thereof, which is generally at a perimeter, to a structural layer, whereas a second portion thereof, which is generally central, is free to move or bend in response to the pressure exerted by the incident acoustic pressure waves. The mobile electrode and the fixed electrode thus form a capacitor, and bending of the membrane that constitutes the mobile electrode causes a variation of capacitance, as a function of the acoustic signal to be detected.

With reference to FIG. 1, an acoustic transducer device 19 is illustrated, represented in a triaxial co-ordinate system x, y, z. The acoustic transducer device 19 comprises a first die 21, which integrates a MEMS structure 1, in particular a MEMS acoustic transducer (microphone), provided with a membrane 2, which is mobile and is made of conductive material, facing a rigid plate 3 (by this term is here meant an element that is relatively rigid as compared to the membrane 2, which is instead flexible). The rigid plate 3 includes at least one conductive layer facing the membrane 2 so that the membrane 2 and the rigid plate 3 form facing plates of a capacitor. The rigid plate 3 and the membrane 2 form a transducing structure, in particular an acoustic transducing structure, for converting a sound wave into an electrical signal.

Alternatively, the transducing structure (in the form of membrane suspended over the cavity 6 may be obtained with a different technology, for example using piezoelectric or piezoresistive elements.

The membrane 2, which in use undergoes deformation as a function of incident acoustic pressure waves, is at least partially suspended over a structural layer 5 and directly faces a cavity 6, obtained by etching in an area corresponding to a rear surface 5b of the structural layer 5 (the rear portion 5b is opposite to a front surface 5a of the structural layer 5, arranged in the proximity of the membrane 2).

The MEMS structure 1 is housed in an inner cavity 8 of a package 20, together with a further die 22 of semiconductor material, which integrates a processing circuit, or ASIC (Application-Specific Integrated Circuit) 22'. The ASIC 22' is electrically coupled to the MEMS structure 1 by an electrical conductor 25', which connects respective pads 26' of the first and second dice 21, 22. The first and second dice 21, 22 are coupled side-by-side on a substrate 23 of the package 20. The first die 21 is coupled to the substrate 23 on the rear surface 5b of the structural layer 5, for example by an adhesive layer; likewise, also the second die 22 is coupled to the substrate 23 on a rear surface 22b thereof. Formed on a front surface 22a of the second die 22, opposite to the rear surface 22b, is the ASIC 22'.

Appropriate metallization layers and vias (not illustrated in detail) are provided in the substrate 23 for routing the electrical signals towards the outside of the package 20. Further electrical connections 25", obtained with the wire-bonding technique, are provided between pads 26" of the second die 22 and respective pads 26" of the substrate 23.

Further coupled to the substrate 23 is a covering 27 of the package 20, which encloses within it the first and second dice 21, 22. Said covering 27 may be made of pre-molded metal or plastic.

Electrical-connection elements 29, for example in the form of conductive lands, are provided on the underside of the substrate 23 (the side exposed outwards), for soldering and electrical connection to a printed circuit.

The substrate 23 further has a through opening, or hole, 28, which arranges the cavity 6 of the first die 21 in fluid communication with the environment external to the package 20. The through opening (hereinafter "sound port") 28 enables introduction of a flow of air from outside the package 20 and of the acoustic pressure waves, which, impacting on the membrane 2, cause deflection thereof.

In a known way, the sensitivity of the acoustic transducer depends upon the mechanical characteristics of the membrane 2 of the MEMS structure 1, and further upon the assembly of the membrane 2 and of the rigid plate 3. In addition, the volume of the acoustic chamber obtained by the cavity 6 directly affects the acoustic performance, determining the resonance frequency of the acoustic transducer.

There are thus numerous constraints imposed on assembly of a MEMS acoustic transducer, which render design thereof particularly problematical, in particular where extremely compact dimensions are desired, such as in the case of portable applications.

In order to protect at least partially the cavity 6 and the membrane 2 from dust and/or water and/or other debris that might penetrate through the through opening 28, thus reducing the useful dimensions of the cavity 6 and/or forming an electrical leakage path, thus jeopardizing the performance of the acoustic transducer, it is known to provide a filter (illustrated only schematically in FIG. 1, and designated by the reference 30) outside the package 20 and facing the sound port 28 (at a distance therefrom). Said filter 30 is, for example, coupled to a protective shell of a portable device (e.g., a cellphone) that houses the package 20.

In particular, in the case of portable applications, the package 20 is housed within the protective shell of the portable device itself so that the sound port 28 in turn faces a respective through opening, or hole, made through the protective shell of the portable device by the filter 30 itself. Filters currently used are mounted manually on the protective shell of the portable device and consequently are excessively large with respect to the actual operating specifications, which is exclusively to protect the cavity 6, in addition, obviously, to the membrane 2 and the rigid plate 3.

Furthermore, the filter 30 prevents entry of contaminating particles through the hole made through the protective shell of the portable device, but does not solve the problem of contamination deriving from particles of dust or other debris coming from different sources (for example, on account of a not perfectly hermetic closing of the protective shell).

Likewise known, as illustrated in FIG. 2 and described in U.S. Pat. No. 9,769,554, is the use of a filter of silicon 32, or of a filtering module including a fabric of strands that form a weave with through openings, arranged between the substrate 23 and the first die 21. The latter solutions provides protection from contaminants during intermediate manufacturing and assembly steps, i.e., during steps of mounting of the package in the portable device. However, in both cases and in general for filters of a known type, the thickness of the filter affects the acoustic performance of the acoustic transducer 19, impacting on the signal-to-noise ratio (SNR). On the other hand, the minimum thickness of the filter is not imposed only by technological limits, but also by the desire for structural solidity of the filter, which should not be subject to damage or breaking during the steps of physical coupling thereof to the substrate and/or to the die that houses the MEMS structure. The filter, in other words, should have a thickness such that it may be handled safely.

Further problems associated to the prior art regard the fact that the filtering module is coupled to the MEMS structure in advanced steps of fabrication of the device so that the MEMS structure is subject to possible contaminating particles throughout the time preceding positioning of the filter.

It is thus desirable to provide a manufacturing method in which the thickness of the filter is not limited by the requisites of thickness imposed by the tools used for handling the filter itself so that the filter has a thickness limited only by the technology used for effective manufacture thereof. It is thus possible to minimize the impact on the signal-to-noise ratio (SNR) of the acoustic transducer that includes said filter.

Further, it is desirable to provide a manufacturing method that will enable protection of the MEMS structure of the transducer right from the first steps of manufacture thereof so that possible contaminating particles do not have an impact on operation of the MEMS structure itself.

BRIEF SUMMARY

One or more embodiments are directed to methods for manufacturing a semiconductor die including a filtering module, a semiconductor die including a filtering module, a package housing the semiconductor die, and an electronic system housing the package. In at least one embodiment, the filtering module is of an integrated type. According to an aspect of the present disclosure, the semiconductor die is an acoustic transducer device (e.g., microphone).

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
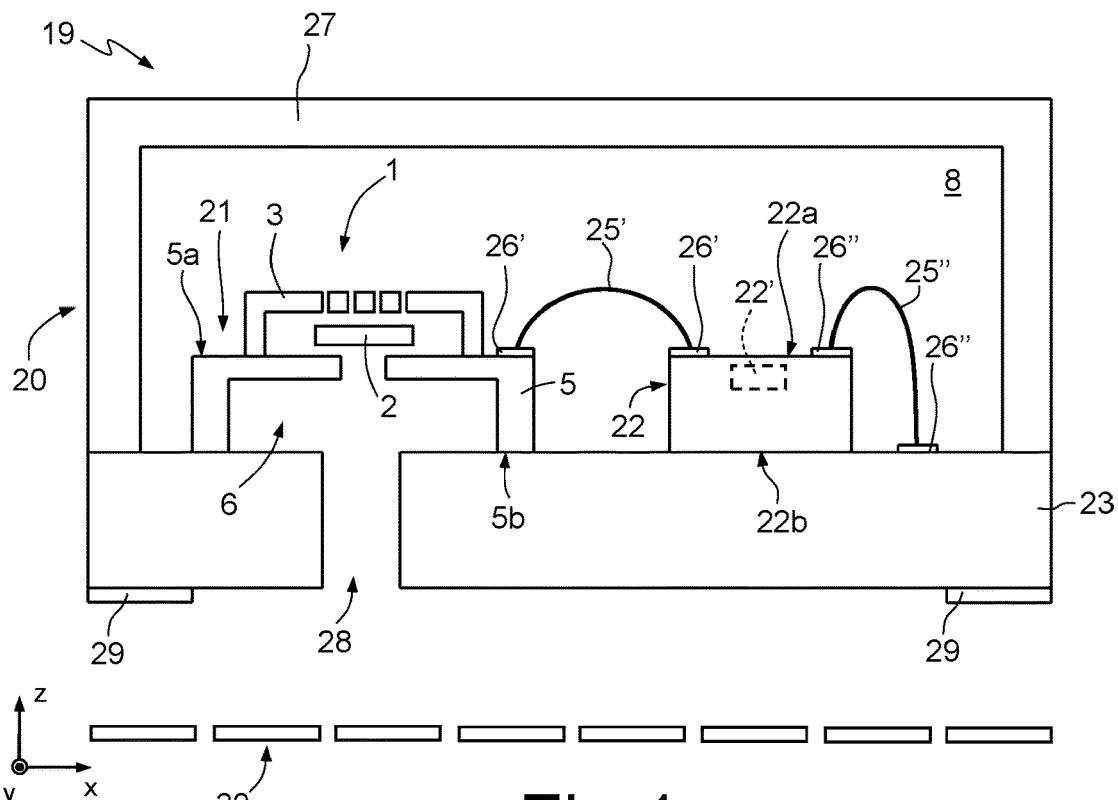
FIGS. 1 and 2 show lateral sectional views of respective packages housing a respective MEMS acoustic transducer provided with anti-particle filters, according to embodiments of a known type.
Figure 2:
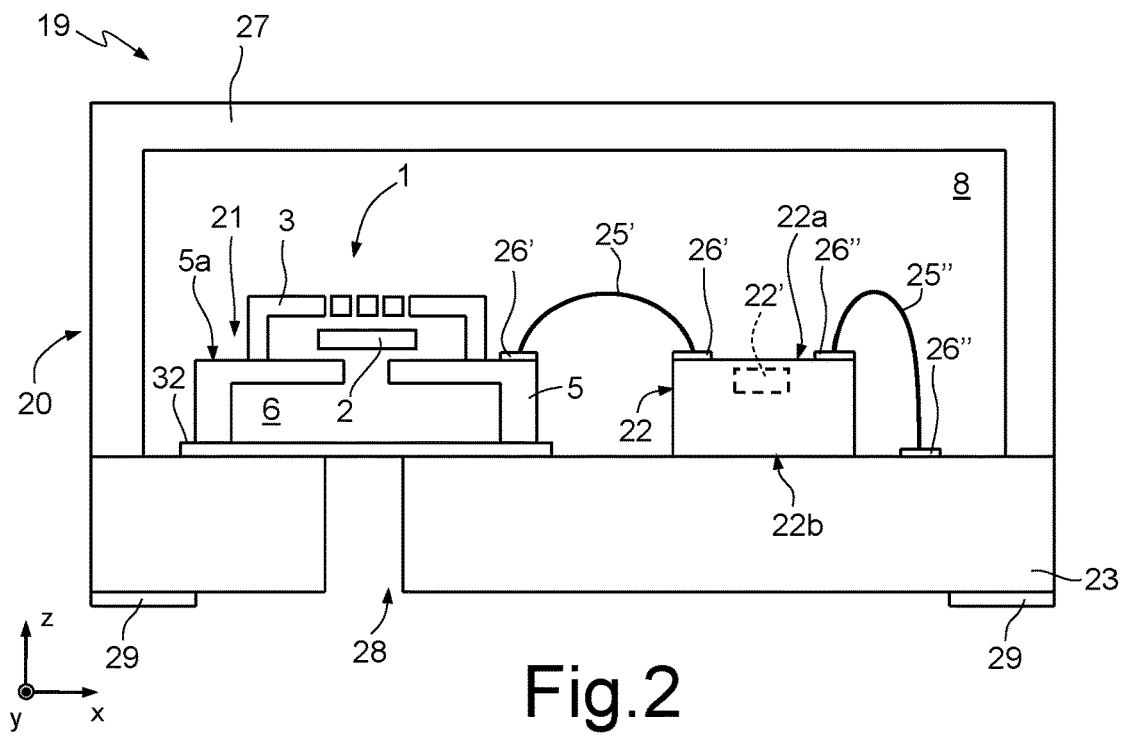
Figure 3:
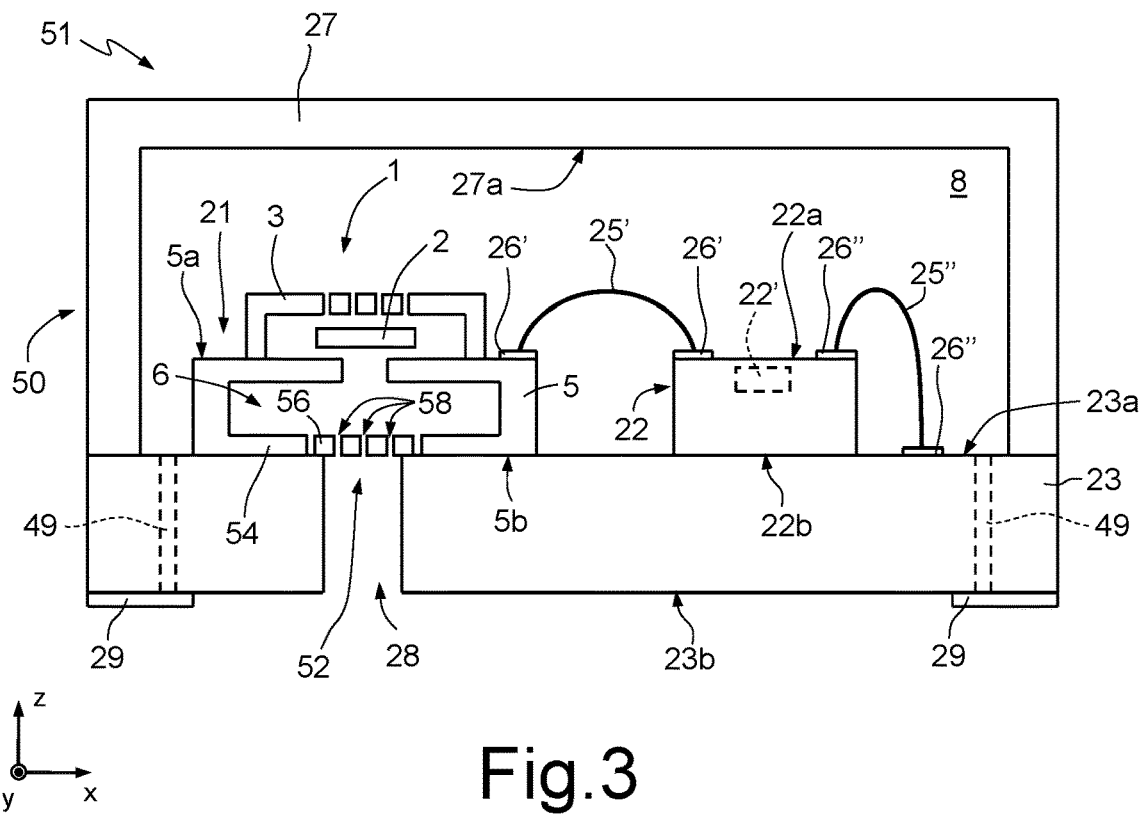
FIG. 3 shows, in lateral sectional view, a package housing a MEMS acoustic transducer provided with an integrated anti-particle filter, according to an embodiment of the present disclosure.

FIG. 3 shows, in lateral sectional view, an acoustic transducer device 51 according to an aspect of the present disclosure. Elements of the acoustic transducer device 51 of FIG. 3 that are in common with those of the acoustic transducer device 19 of FIGS. 1 and 2 are designated by the same reference numbers and are not described any further.

In greater detail, the acoustic transducer device 51 of FIG. 3 includes a package 50, formed by the base substrate 23 and by the covering element 27. The latter is substantially cup-shaped, and is coupled to the base substrate 23 to form the cavity, or inner space, 8 of the package 50. Made throughout the thickness of the base substrate 23 is the through opening 28, designed to arrange the cavity 6 of the first die 21 in acoustic communication with the environment external to the package 50. In what follows, the through opening 28 will also be referred to as "sound port," and the cavity 6 of the first die 21 will also be referred to as "acoustic chamber." Furthermore, the term "acoustic communication" is here used with the meaning of "direct acoustic communication," in the sense that generic sound waves, or acoustic pressure waves, propagate in the environment considered using as sole medium of propagation air (or a possible gas, or mixture of gases, equivalent to air from the standpoint of acoustic propagation).

The extension (in the horizontal plane xy) of the acoustic chamber 6 is greater than the corresponding extension (once again in the horizontal plane xy) of the sound port 28, so that the sound port 28 communicates entirely with the acoustic chamber 6 without having a direct outlet to the inner space 8 of the package 50.

According to an aspect of the present disclosure, the acoustic chamber 6 of the first die 21 is in acoustic communication with the sound port 28 exclusively through a filtering module 52, which extends between the sound port 28 and the acoustic chamber 6 of the first die 21. More in particular, the filtering module 52 extends between the substrate 23 and the structural layer 5. Even more in particular, the filtering module 52 extends as a continuation of the structural layer 5 without any additional intermediate layer arranged between the structural layer 5 and the filtering module 52. In other words, the filtering module 52 extends seamlessly as a prolongation of the structural layer 5; namely, the filtering module 52 and the structural layer 5 form a monolithic block.

For clarity of description, the filtering module 52 may be functionally divided into a supporting portion 54 and a filtering portion 56, co-planar to one another and extending one after another without interruptions. The supporting portion 54 is in contact with the substrate 23 on one side and with the structural layer 5 on the other side, whereas the filtering portion 56 extends in a position corresponding to the sound port 28 and forms a filtering interface for contaminating particles coming from the environment external to the acoustic transducer device 51 and directed towards the acoustic chamber 6. In this context, it is the supporting portion 54 that is in direct contact, without any interruption, with the structural layer 5.

The extension (in the horizontal plane xy) of the filtering module 52 is greater than the corresponding extension (once again in the horizontal plane xy) of the sound port 28, so that the sound port 28 is entirely surrounded (once again viewed in the horizontal plane xy) by the filtering module 52.

According to an aspect of the present disclosure, the filtering module 52, and in particular the filtering portion 56, has a uniform thickness for example comprised between 1 µm and 100 µm, in particular 5 µm, and has a plurality of through openings such that the sound waves directed towards the acoustic chamber 6 are not interrupted, or are not notably degraded, by the presence of the filtering module 52.

The filtering module 52 may be made of any material compatible with the processes of manufacture of semiconductor devices, in particular, of insulating material, such as silicon dioxide or silicon nitride, or semiconductor material, such as silicon monocrystalline or polysilicon, or alternatively any other material compatible with the processes of manufacture of semiconductor devices.

The base substrate 23 is, in a non-limiting embodiment, formed by a multilayer structure, made up of one or more layers of conductive material (generally metal) separated by one or more dielectric layers (for example, constituted by a BT (Bismaleide Triazine) laminate. Electrical paths 49 are provided through the base substrate 23 for connecting an inner surface 23a thereof, facing the inner space 8, to an outer surface thereof 23b, facing the external environment, which supports the electrical-connection elements 29. The latter are obtained, in particular, in the form of lands. in the case of so-called LGA (Land-Grid Array) packages, as is the case illustrated in FIG. 2. Alternatively, the lands 29 may be replaced by an array of balls or bumps, obtaining a so-called BGA (Ball-Grid Array) package.

According to a different embodiment, the base substrate 23 does not comprise layers of metal or conductive material in general and, for example, is made of plastic material.

The covering element 27 may also be formed by a multilayer, for example including one or more plastic and/or metal layers, and may present a metal coating (not illustrated) on an inner surface 27a thereof, facing the inner space 8, in order to provide an electromagnetic shield. Alternatively, the covering element 27 is completely made of metal.

The covering element 27 is further coupled to the base substrate 23 so as to seal the inner space 8 hermetically.

In a way not illustrated in the figures, a first coupling layer extends between the inner surface 23a of the base substrate 23 and the first die 21. A second coupling layer extends between the inner surface 23a of the base substrate 23 and the filtering module 52. In one embodiment, the first and second coupling layers coincide and form a single coupling layer, obtained, for example, by applying preferably non-conductive glue. A further respective coupling layer (for example, of preferably non-conductive glue or biadhesive tape) extends, in a way not illustrated in the figure, between the inner surface 23a of the base substrate 23 and the second die 22.

Figure 4A:
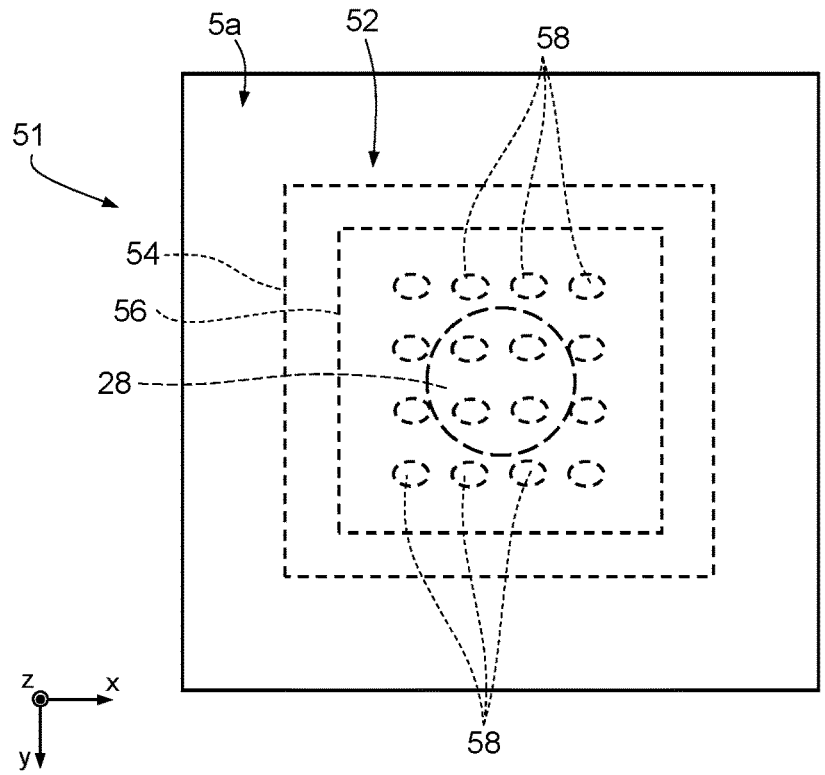
FIGS. 4A and 4B are top plan views of a portion of the package of FIG. 3.

FIG. 4A is a schematic top plan view, in the plane xy, of a portion of the acoustic transducer device 51. In particular, FIG. 4A illustrates the arrangement of the filtering module 52 with respect to the structural layer 5. The filtering module 52 here has a parallelepipedal shape. Further, as has been said, the filtering portion 56 has a plurality of filtering openings 58, for example with circular cross section having a diameter comprised between 1 µm and 10 µm, in particular 5 µm. Consequently, any contaminating particles (e.g., dust) having at least one dimension (length, width, or thickness) greater than the diameter chosen for the filtering openings 58 are hindered from passing from an environment external to the cavity 6 towards the inside of the cavity 6 (or in any case find it difficult to pass through). Any contaminating particles having all the dimensions (length, width, and thickness) greater than the diameter chosen for the filtering openings 58 are completely filtered by the filtering openings 58.

In other embodiments (not illustrated), the filtering openings 58 may have a polygonal cross section of dimensions such that a circumference inscribed in the polygon has a diameter comprised in the same range specified for the aforementioned circular cross section. Consequently, the filtering portion 56 prevents passage of contaminating particles having dimensions larger than the aforesaid diameter.

The filtering openings 58 may be arranged in a matrix configuration, in which mutually adjacent filtering openings 58 are at a distance apart from one another (measured in the horizontal plane xy between the respective centroids) comprised between 3 µm and 15 µm, in particular 7 µm. In other embodiments, the filtering openings 58 may be arranged in an irregular way.

The filtering openings 58 extend, in particular, in a central region of the filtering module 52/filtering portion 56, substantially aligned in top plan view to the through opening 28.

In general, the number of filtering openings 58 is selected so as to maximize the ratio between the sum of the areas (measured in the horizontal plane xy) of the filtering openings 58 and the area of the suspended portion of the filtering module 52 (measured in the horizontal plane xy limitedly to the regions of the filtering module 52 extending around the filtering openings 58, i.e., around the solid parts of the filtering portion 56). For instance, the ratio between the sum of the areas of the filtering openings 58 and the area of the suspended portion of the filtering module 52 is comprised between 0.3 and 0.7, in particular 0.45. This ratio coincides with the ratio between the sum of the volumes of the filtering openings 58 and the volume of the remaining suspended portions of the filtering module 52.

Figure 4B:
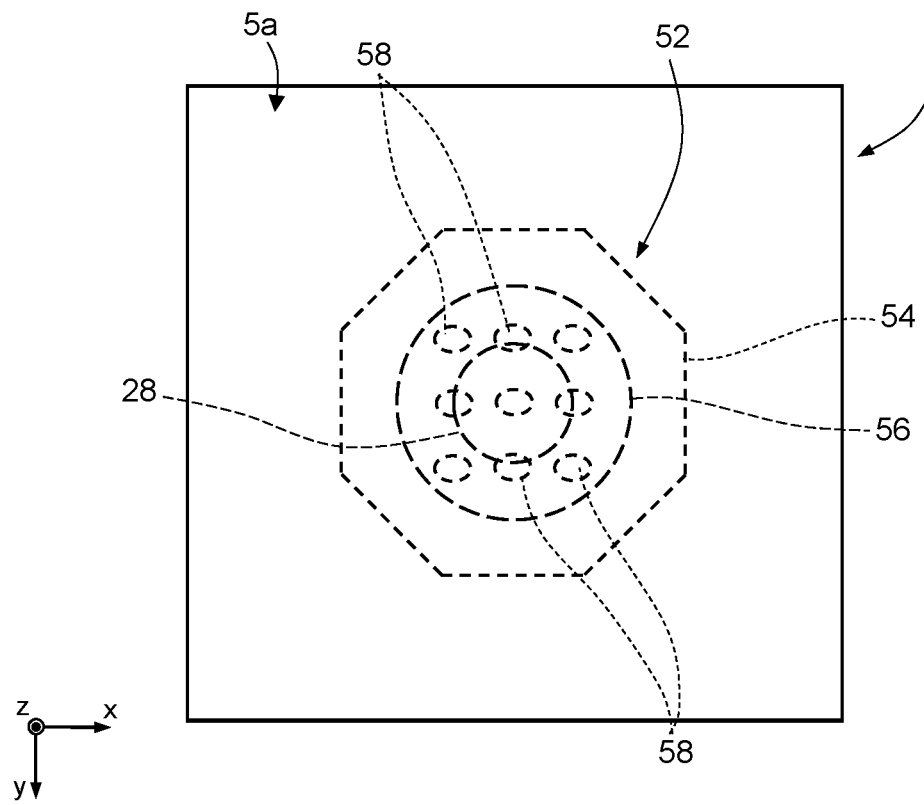

FIG. 4B is a schematic top plan view (in the plane xy) of a portion of the acoustic transducer device 51 according to an embodiment of the present disclosure that is alternative to that of FIG. 4A.

In the embodiment of FIG. 4B, the filtering module 52 has the shape of a prism with polygonal base, for example octagonal.

FIGS. 5A-5D show a method for manufacturing the acoustic transducer 51, with particular reference to steps for manufacturing the filtering module 52 directly coupled, or bonded, to the structural layer 5, so that the filtering module 52 extends as a prolongation of the structural layer 5 without any additional intermediate layer arranged in between (i.e., they forming a monolithic block).

Figure 5A:
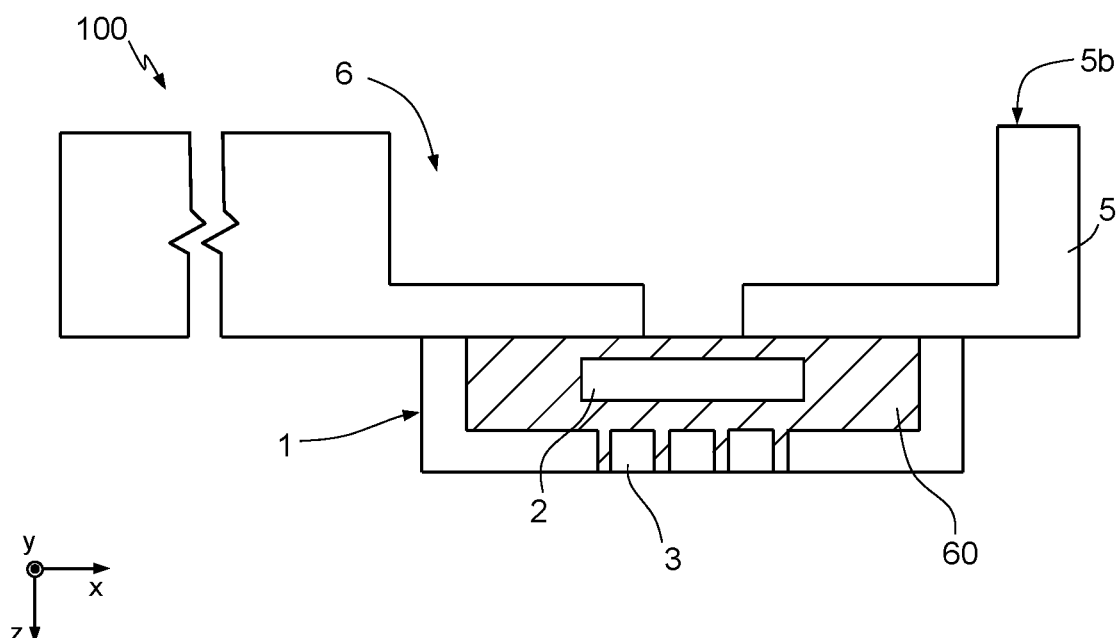
FIGS. 5A-5D illustrate, in lateral sectional view, steps for manufacturing the MEMS acoustic transducer provided with the integrated anti-particle filter, according to an embodiment of the present disclosure.

With reference to FIG. 5A, a wafer 100 including the MEMS structure 1 is provided, the structure being in an intermediate manufacturing step (per se known). Here, the MEMS structure 1 is in a semifinished condition for fabrication of a MEMS microphone of the type described with reference to FIG. 1, i.e., in a step where the membrane 2 and the rigid plate 3 are embedded in, and constrained to one another by, one or more sacrificial layers 60, for example, of silicon oxide. Furthermore, in this intermediate manufacturing step, the structural layer 5 has already been machined so as to remove selective portions thereof to form, at least in part, the acoustic cavity 6.

Figure 5B:
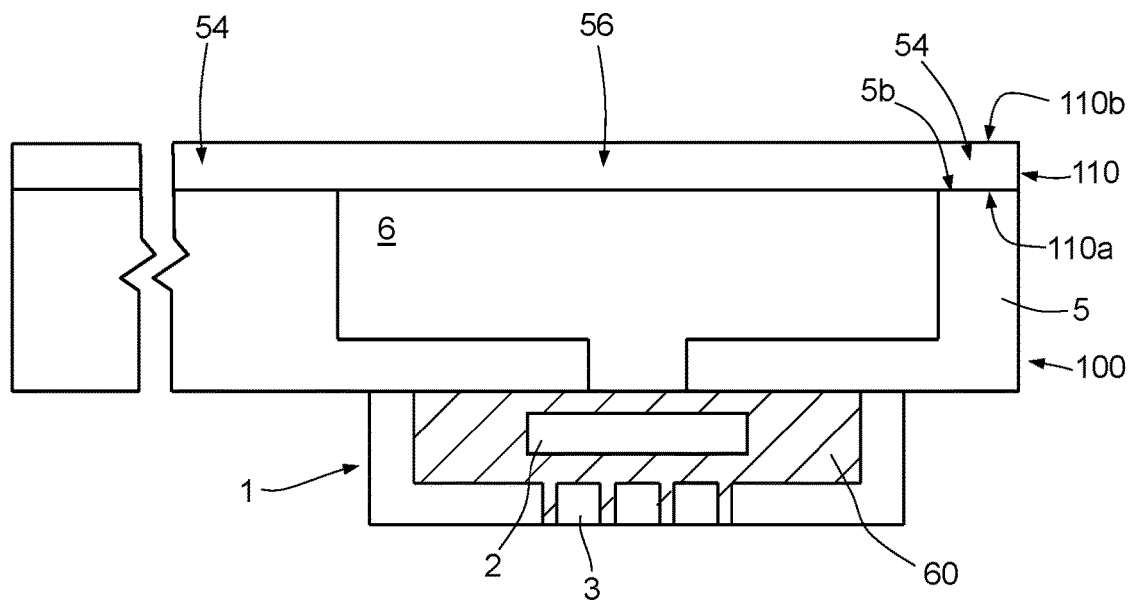

With reference to FIG. 5B, a step is carried out of bonding of the wafer 100 to a further wafer 110 (in particular of semiconductor material, here silicon) by wafer-to-wafer bonding techniques of a per se known type. In particular, the wafer 100 is bonded to the wafer 110 so that a surface 110a of the wafer 110 is arranged directly facing the rear surface 5b of the structural layer 5 of the MEMS structure 1. This bonding step is carried out according to a method of direct bonding or fusion bonding.

For this purpose, the wafer 110 is arranged in direct contact with the wafer 100, in the absence of additional intermediate layers. The bonding process is based upon creation of chemical bonds between the two contact surfaces. For this purpose, it is expedient for both of the surfaces to be clean, flat, and not to present surface roughness.

In greater detail, a step of pre-treatment of the wafer 110 is carried out, which includes a reduction of the thickness of the wafer 110 to bring it to a thickness, in the direction z, comprised between 10 and 100 µm, for example by a grinding step followed by an optional polishing step to reduce the surface roughness. A similar polishing step may be carried out, optionally, on the wafer 100, in the area of the structural layer 5.

The wafer 100 and the wafer 110 are arranged in contact with one another, for carrying out a pre-bonding step at room temperature, possibly with application of force in the region of a few kilonewtons, for example between 1 kN and 10 kN. This step may be skipped.

Annealing at high temperature is carried out, with the wafer 100 and the wafer 110 in contact with one another (possibly by applying thereon a pressure in the region of a few kilonewtons, for example between 1 kN and 10 kN) and at a temperature comprised between 300° C. and 500° C.

The aforementioned pre-treatment of the wafer 110 and/or of the wafer 100 may include steps of surface activation (e.g., plasma treatment, or CMP), useful for favoring a stable bonding between the wafers 100, 110.

Figure 5C:
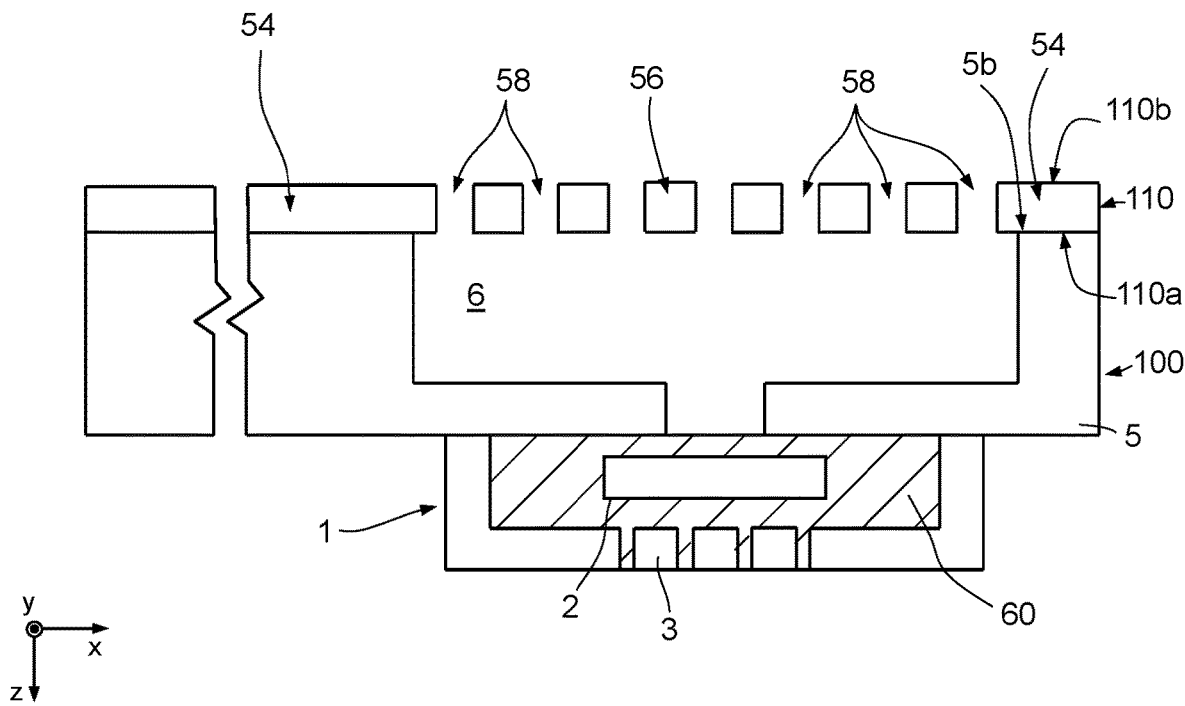

With respect to FIG. 5C, masked etching of the wafer 110 is performed. The masked etching is performed at a surface 110b thereof opposite to the surface 110a, using an appropriate photolithographic mask shaped so as to expose selective portions of the wafer 110 in the areas where the filtering openings 58 of the filtering portion 56 are to be formed.

Masked etching of the wafer 100 is carried out via techniques of surface micromachining of a known type, using etching chemistries that remove selectively the material of the substrate 101 (here, silicon) but not the material of the sacrificial layer 60 (here, silicon oxide). Consequently, at the end of masked etching of the wafer 110, the filtering module 52 is obtained, provided with through openings that correspond to the filtering openings 58 described previously. The thickness of the filtering portion 56 is represented by the thickness of the wafer 110.

Figure 5D:
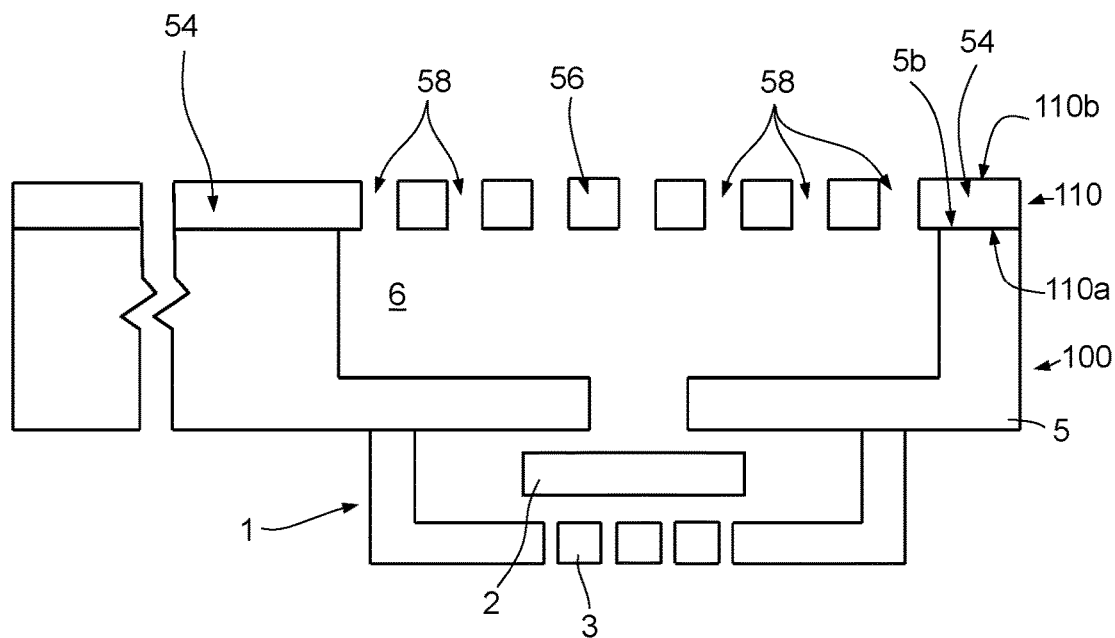

With reference to FIG. 5D, a step of release of the suspended elements of the MEMS structure 1, by removing the sacrificial layer 60, for example by a wet etch (in an HF bath in the case where said sacrificial layer 60 is made of silicon oxide).

A subsequent step (not illustrated) of sawing of the stack formed by the wafers 100 and by the filtering module 52 (singulation step) enables isolation of the first die 21 from other elements (in particular, other dice of the same type) formed during the previous steps.

FIGS. 6A-6E show, according to a further embodiment of the present disclosure, a process for manufacturing the acoustic transducer 51 alternative to that of FIGS. 5A-5D. The manufacturing process described here makes particular reference to steps of manufacture of the filtering module 52, which that is directly coupled, or bonded, to the structural layer 5, so that the filtering module 52 extends as a prolongation of the structural layer 5 without any additional intermediate layer arranged in between (i.e., they form a monolithic block).

Figure 6A:
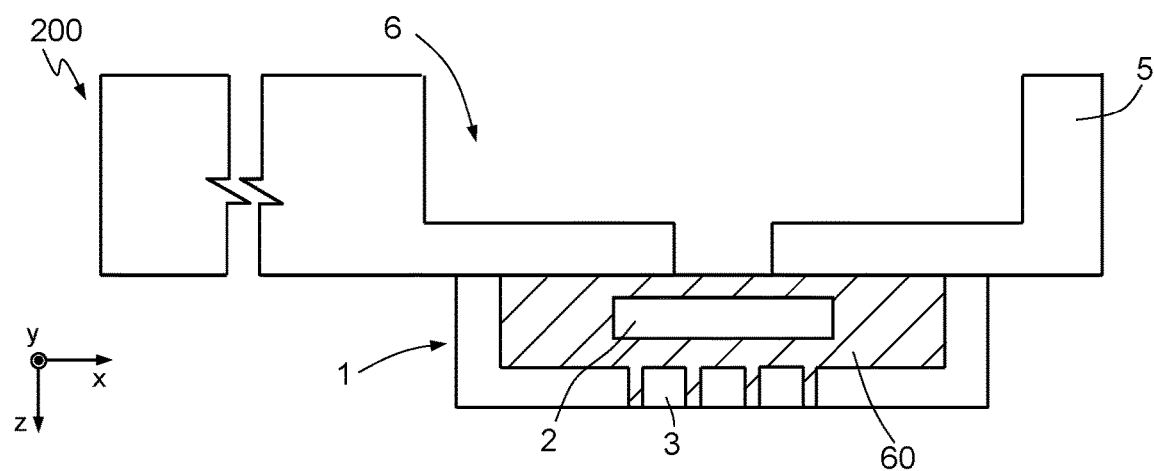
FIGS. 6A-6E illustrate, in lateral sectional view, steps for manufacturing the MEMS acoustic transducer provided with the integrated anti-particle filter, according to a further embodiment of the present disclosure.

With reference to FIG. 6A, a wafer 200 including the MEMS structure 1 is provided, the structure being in an intermediate manufacturing step (per se known). Here, the MEMS structure 1 is in a semifinished condition for fabrication of a MEMS microphone of the type described with reference to FIG. 1, i.e., in a step in which the membrane 2 and the rigid plate 3 are embedded in, and constrained to one another by, one or more sacrificial layers 60, for example, of silicon oxide. Further, in this intermediate manufacturing step, the structural layer 5 has already been machined so as to remove selective portions thereof to form, at least in part, the cavity 6.

Figure 6B:
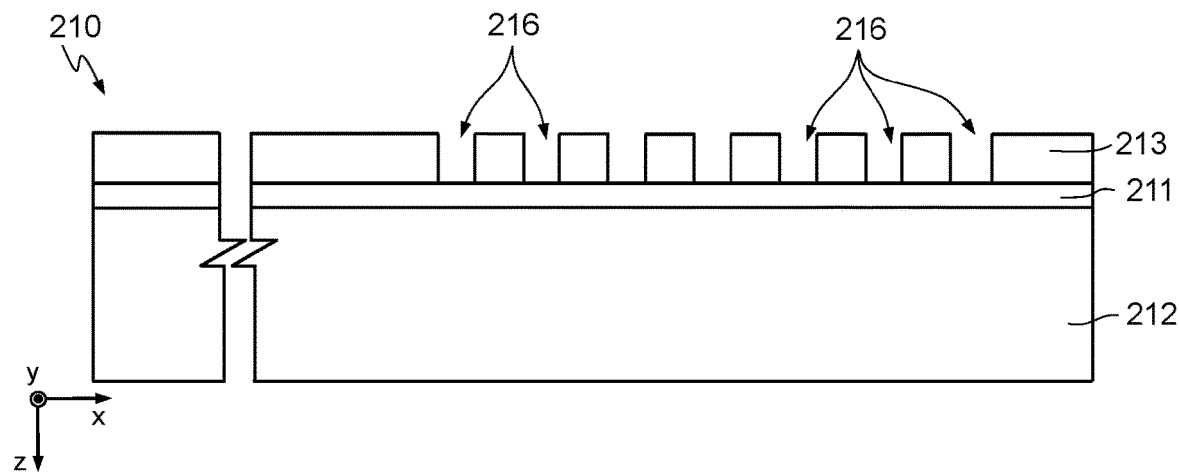

With reference to FIG. 6B, a SOI (Silicon-On-Insulator) stack 210 is provided, which includes, in a per se known manner, an intermediate layer 211, in particular, of silicon oxide, arranged between a first substrate 212 and a second substrate 213 (e.g., both of silicon).

According to an aspect of the present disclosure, the second substrate 213 of the SOI stack 210 has a thickness comprised between 1 µm and 100 µm, in particular 5 µm, namely, equal to the thickness desired for the filtering module 52 (more in particular, for the filtering portion 56). Furthermore, the second substrate 213 of the SOI stack 210 is machined by lithographic and masked-etching steps, to form a plurality of through openings 216. These openings have a shape and size chosen according to the specifications and in particular corresponding to the size specifications for the filtering openings 58. In fact, in subsequent manufacturing steps, the through openings 216 will form the filtering openings 58.

Figure 6C:
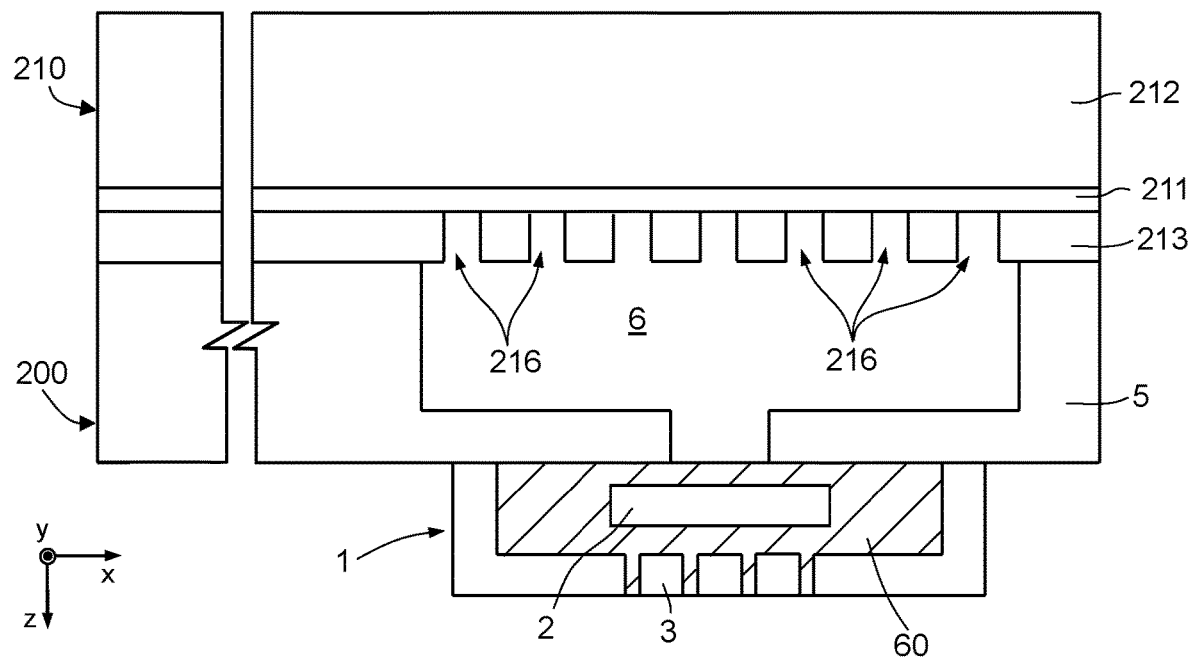

With reference to FIG. 6C, the SOI stack 210 is bonded to the wafer 200 so that the second substrate 213 is in direct contact with the structural layer 5, and the through openings 216 previously formed directly face the cavity 6. The SOI stack 210 is mechanically bonded to the wafer 200 in the absence of further intermediate coupling layers. For instance, a direct-bonding or fusion-bonding technique may be used, as described previously with reference to FIG. 5B.

Figure 6D:
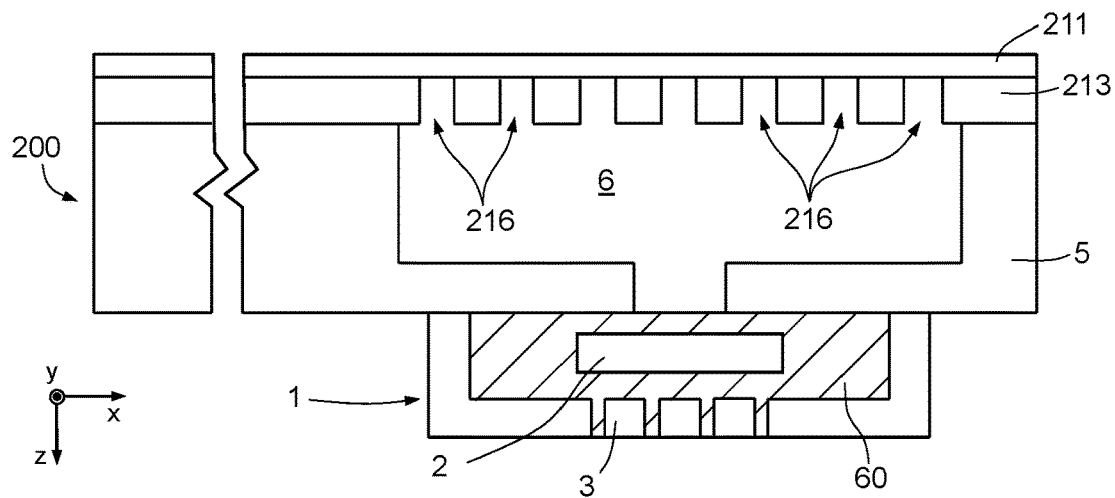

With reference to FIG. 6D, the first substrate 212 is removed (for example, via a process of grinding combined with a process of etching of the silicon, using the intermediate layer 211 as etch-stop layer), thus exposing the intermediate layer 211.

Figure 6E:
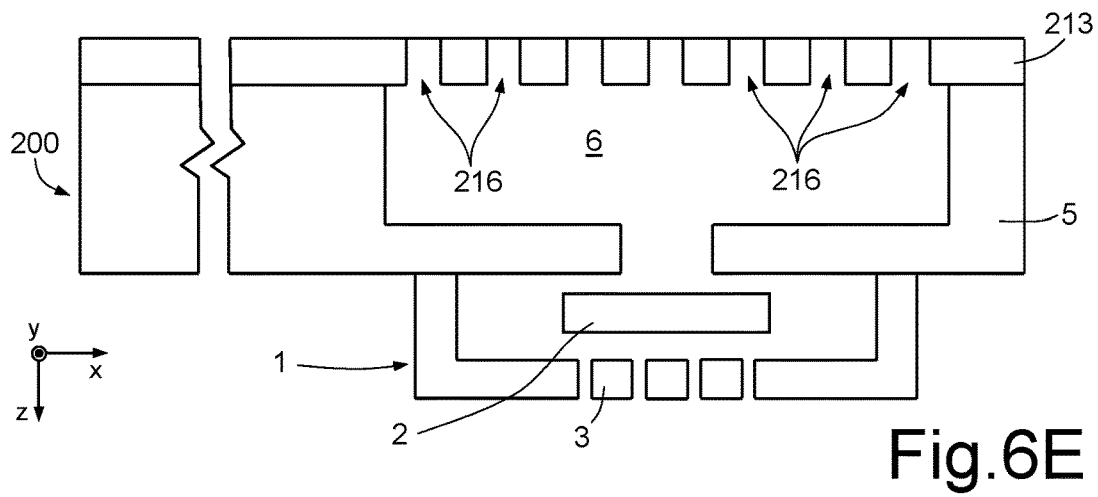

With reference to FIG. 6E, a wet etch is made, in particular in an HF bath, to remove at the same time the intermediate layer 211 and the sacrificial layer 60, thus releasing the suspended elements of the MEMS structure 1 and forming the filtering module 52.

In a way not illustrated in the figures, a step of sawing or singulation of the stack formed by the wafer 200 and by the filtering module 52 just formed is carried out so as to obtain the first die 21.

Figure 7:
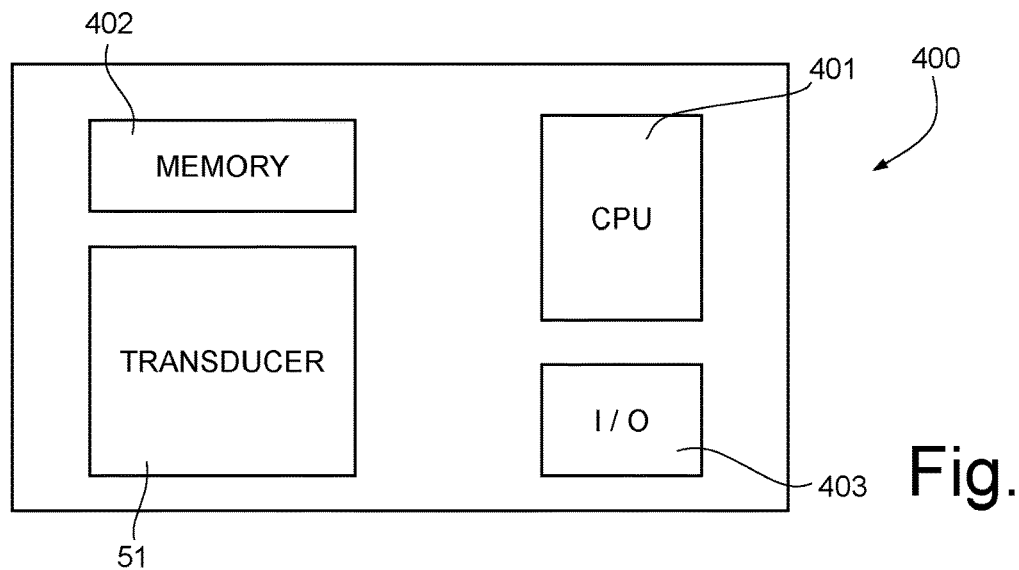
FIG. 7 shows an electronic system including an acoustic transducer device according to the present disclosure.

FIG. 7 shows an electronic system 400 that uses the acoustic transducer device 51 according to the present disclosure.

The electronic system 400 comprises, in addition to the acoustic transducer device 51, a microprocessor (CPU) 401, a memory block 402, connected to the microprocessor 401, and an input/output interface 403, for example a keypad and/or a display, which is also connected to the microprocessor 401.

The acoustic transducer device 51 communicates with the microprocessor 401, and in particular transmits the electrical signals processed by the ASIC 22' of the second die 22 associated to the MEMS sensing structures of the first die 21.

The electronic system 400 is, for example, a mobile communication device, a cellphone, a smartphone, a computer, a tablet, a PDA, a notebook, but also a voice recorder, a player of audio files with voice-recording capacity, a console for video games, or an electronic device of some other type.

From an examination of the characteristics of the disclosure described and illustrated herein, the advantages that it affords are evident.

For instance, minimization of the thickness of the filtering module 52, and its complete integration with the MEMS structure 1, causes the impact of the filtering module 52 on the signal-to-noise ratio of the acoustic transducer device to be negligible.

Further, the reduced thickness of the filtering module 52 enables reduction of the impact of the filtering module 52 on the acoustic performance of the acoustic transducer device.

Furthermore, it is possible to integrate the filtering module 52 in the acoustic transducer device with greater flexibility as compared to the prior art.

Further, the filtering module, after being fixedly coupled to the MEMS structure, immediately protects the MEMS structure from contaminating particles, before the device leaves the front-end production plant. The MEMS structure is thus protected also in the steps of transport and assembly.

Further, no additional manufacturing processes are necessary, during assembly, beyond those already envisaged for assembly of just the MEMS structure in its package.

Finally, it is clear that modifications and variations may be made to the disclosure described and illustrated herein, without thereby departing from the scope of the present disclosure.

For instance, the step of FIG. 5B, in which the step of bonding the wafer 100 to a further wafer 110 is carried out by direct bonding or fusion bonding, may envisage the presence of one or more silicon-oxide layers ($SiO_2$) between the wafer 100 and the wafer 110.

Figure 8:
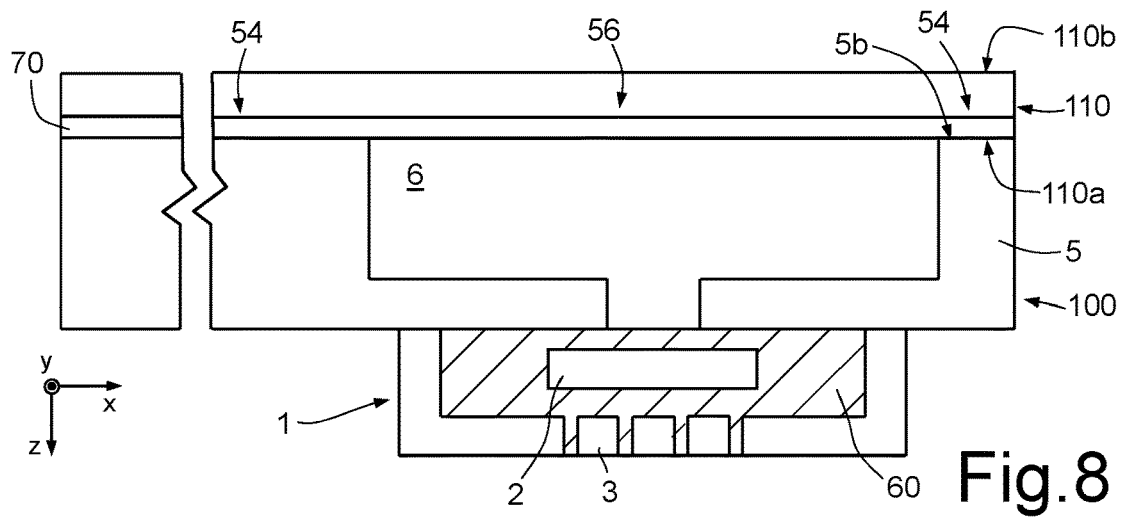
FIGS. 8-10 show, according to respective embodiments, respective steps of the manufacturing process alternative to one another and to the step of FIG. 5B.

In this connection, FIG. 8 shows, in the same manufacturing step as that of FIG. 5B and according to a further embodiment of the present disclosure, the wafer 110, which presents a silicon-oxide layer 70 extending at the surface 110a (i.e., the surface 110a is the surface of the oxide layer 70). The wafer 110 is bonded to the wafer 100 so that said silicon-oxide layer 70 is arranged directly facing, and in contact with, the rear surface 5b of the structural layer 5 of the MEMS structure 1. A step of direct bonding or fusion bonding of a per se known type, or according to what has been described previously with reference to FIG. 5B, provides stable coupling between the wafers 100 and 110 or, more precisely, between the silicon-oxide layer 70 and the silicon of the surface 5b. In the subsequent step of creation of the filtering openings 58 of FIG. 5C, the silicon-oxide layer operates as etch-stop layer, and is removed during the step of wet etching (e.g., in HF) already described with reference to FIG. 5D.

Figure 9:
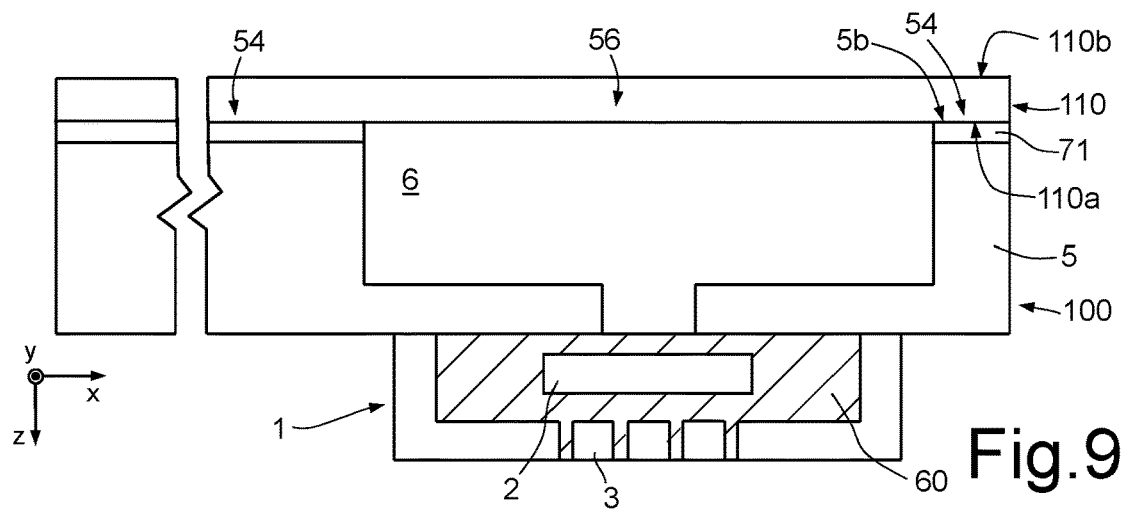

According to a further embodiment of the present disclosure, illustrated in FIG. 9, the wafer 100 has a silicon-oxide layer 71 extending at the surface 5b (i.e., the surface 5b is the surface of the silicon-oxide layer 71). The wafer 110 is bonded to the wafer 100 so that the silicon-oxide layer 71 is arranged directly facing, and in contact with, the surface 110a of the wafer 110. A step of direct bonding or fusion bonding of a per se known type, or according to what has been described previously with reference to FIG. 5B, provides stable coupling between the wafers 100 and 110 or, more precisely, between the silicon-oxide layer 71 and the silicon of the surface 110a.

Figure 10:
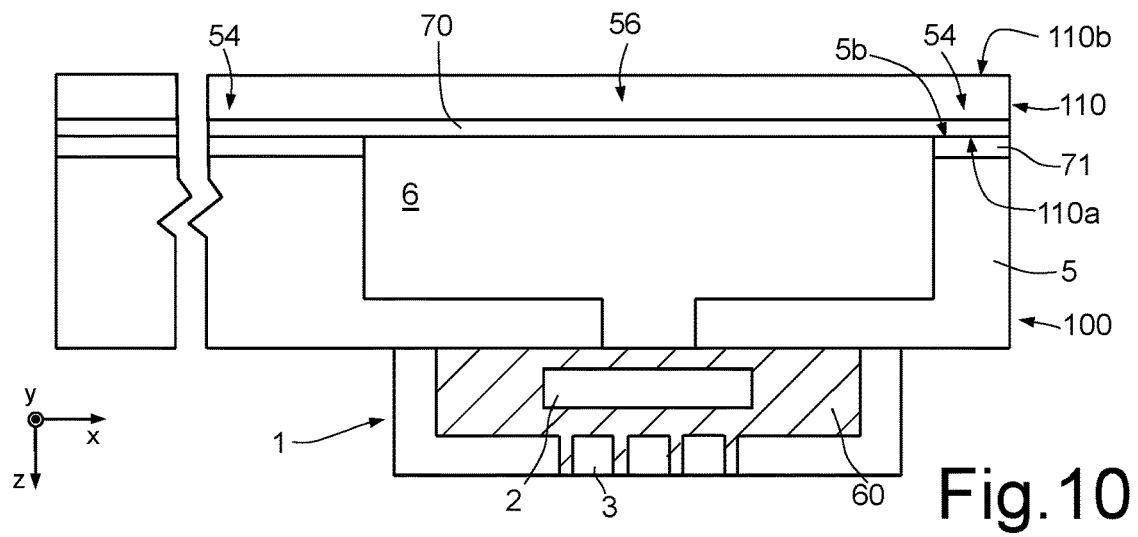

According to a further embodiment of the present disclosure (illustrated in FIG. 10), both the wafer 100 and the wafer 110 have a respective silicon-oxide layer 71, 70 that forms the surface 5b, 110a, respectively. The wafer 110 is bonded to the wafer 100 so that the respective silicon-oxide layers 70, 71 are arranged directly facing, and in contact with, one another. A step of direct bonding or fusion bonding of a per se known type, or according to what has been described previously with reference to FIG. 5B, provides stable coupling between the wafers 100 and 110 or, more precisely, between the silicon-oxide layers 70 and 71. In the subsequent step of creation of the filtering openings 58 of FIG. 5C, the silicon-oxide layer carried by the wafer 110 operates as etch-stop layer, and is removed during the step of wet etching (e.g., in HF) already described with reference to FIG. 5D.

The variant embodiments described herein likewise apply to the embodiment of FIGS. 6A-6E, where the filter is obtained starting from a SOI wafer.

According to further variants of the present disclosure, the filtering module 52 may have different shapes in plan view in the plane xy, for example circular or elliptical or generically polygonal, or polygonal with rounded corners.

Further, it is possible to perform additional steps in the manufacturing process of FIGS. 5A-5D and in the manufacturing process of FIGS. 6A-6E, to form a layer of hydrophobic material (for example, $SiO_2$) on the surface of the filtering portion 56 facing, in use, the sound port 28. For instance, with reference to FIG. 6D, if the intermediate layer 211 is made of hydrophobic material, it may not be completely removed.

Furthermore, with reference to all the embodiments described previously, it is possible to envisage integration of conductive paths on the surface of the filtering portion 56 facing, in use, the sound port 28. Appropriate connection paths to biasing means external to the filtering module 52 may be integrated in the base substrate 23 and used for electrostatically biasing the filtering portion 56 in order to bestow hydrophobic characteristics on the filtering module 52. For this purpose, the base substrate 23 may be a substrate of an LGA type, comprising an inner core and one or more metal layers that extend on opposite faces of the core. The core is, for example, defined by a die of rigid dielectric material, for instance FR4.

Further, it is possible to arrange the first die 21 provided with the filtering module 52 in a recess of the base substrate 23 to reduce further the occupation of space along Z within the package.

Finally, for each of the embodiments described previously, a different configuration of the MEMS acoustic transducer device may be envisaged, in particular as regards to the geometrical shape of the constituent elements. In the case where the space inside the package so allows, a number of MEMS sensors, in addition to the MEMS acoustic transducer, may possibly be housed within the same package, each sensor possibly being provided with a sensitive element that requires a communication to the external environment. Further integrated circuits (e.g., ASICs) may further be provided and housed within the same package.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a semiconductor die, comprising:
   coupling a structural layer having a cavity and integrating a filtering module to a Micro-Electro-Mechanical System (MEMS) device, the MEMS device having a membrane facing a rigid plate, wherein a first portion of the filtering module extends in a position corresponding to the cavity; and
   removing selective portions of the filtering module at the first portion to form a plurality of through openings that places the cavity in fluidic communication with an environment external to the semiconductor die,
   wherein the filtering module is formed from a stack including an intermediate layer arranged between a first substrate and a second substrate,
   wherein coupling the structural layer to the MEMS device comprises bonding the structural layer to the second substrate so that the plurality of through openings directly face the cavity, and
   wherein removing selective portions of the filtering module includes removing, at the plurality of through openings, the first substrate completely and the intermediate layer at least partially.

2. The method according to claim 1, wherein coupling the filtering module to the MEMS device comprises direct bonding or fusion bonding the filtering module to the structural layer of the MEMS device without an intermediate layer between the structural layer and the filtering module.

3. The method according to claim 1, wherein coupling the filtering module to the MEMS device comprises coupling the structural layer to the filtering module such that the intermediate layer is between the structural layer and the filtering module.

4. The method according to claim 1, wherein removing selective portions of the filtering module comprises etching selective portions of the filtering module to form a plurality of through openings in the filtering module at the first portion, the plurality of through openings having a shape and size that hinders passage of particles having at least one dimension greater than 5 microns.

5. The method according to claim 1, further comprising reducing a thickness of the filtering module to a range between 1 microns and 100 microns.

6. The method according to claim 1, wherein the stack is a Silicon-On-Insulator (SOI) stack, wherein the intermediate layer is silicon oxide, and wherein the first substrate and the second substrate are silicon.

7. The method according to claim 1, further comprising thinning the second substrate to a range between 1 microns and 100 microns.

8. The method according to claim 1, wherein the MEMS device is an acoustic transducer device and the cavity is an acoustic chamber of the acoustic transducer device, and
   wherein the filtering module enables passage of acoustic waves while hindering passage of contaminating particles from the external environment to the acoustic chamber.

9. The method according to claim 1, further comprising forming a hydrophobic layer on a side of the filtering module that faces away from the cavity.

10. The method according to claim 1, wherein the membrane and the rigid plate are capacitively coupled to each other.

11. A semiconductor die, comprising:
    a Micro-Electro-Mechanical System (MEMS) device coupled to a structural layer having a through cavity and integrating a filtering module, the MEMS device including a membrane suspended and facing a rigid plate, the membrane located over the cavity at a first side of the structural layer; and
    the filtering module formed in the structural layer at a second side opposite to the first side, a first portion of the filtering module extending over the cavity and a second portion of the filtering module extending seamlessly as a prolongation of the structural layer,
    wherein the first portion of the filtering module includes a plurality of through openings configured to place the cavity in fluidic communication with an environment external to the semiconductor die, wherein the filtering module is formed from a stack including an intermediate layer between a first layer and the structural layer.

12. The semiconductor die according to claim 11, wherein each of the plurality of through openings has a shape and size that hinders passage of contaminating particles having at least one dimension greater than 5 microns.

13. The semiconductor die according to claim 11, wherein the intermediate layer is a silicon-oxide layer between the structural layer and the first layer.

14. The semiconductor die according to claim 11, wherein the filtering module is made of semiconductor material and has a thickness, measured in a direction of propagation of the sound wave, between 1 microns and 100 microns.

15. The semiconductor die according to claim 11, wherein the filtering module comprises a layer of hydrophobic material on a side facing away from the cavity.

16. The semiconductor die according to claim 11, wherein the MEMS device is an acoustic transducer device, and the cavity is an acoustic chamber of the acoustic transducer device.

17. An electronic system, comprising:
    a semiconductor package including:
       a base substrate having a sound port in acoustic communication with an environment external to the package;
       a covering element defining, together with the base substrate, an inner space of the package; and a semiconductor die in the inner space of the package, the semiconductor die including a Micro-Electro-Mechanical System (MEMS) device and is coupled directly to a structural layer, wherein the structural layer includes an integrally formed filtering module and a through cavity, wherein the MEMS device has a membrane and a rigid plate facing the membrane, wherein a first portion of the filtering module faces the cavity and a second portion of the filtering module extends seamlessly as a prolongation of the structural layer, and wherein the first portion of the filtering module includes a plurality of through openings configured to place the cavity in fluidic communication with an environment external to the semiconductor die, wherein the filtering module is formed from a Silicon-On-Insulator (SOI) stack comprising an intermediate layer of silicon oxide between first and second layers of silicon.

18. The electronic system according to claim 17, wherein the electronic system is at least one of: a smartphone, a cellphone, a computer, a tablet, a personal digital assistant (PDA), a notebook, a voice recorder, an audio player, or a console.

19. The electronic system according to claim 17, further comprising a microprocessor coupled to the semiconductor package.

\* \* \* \* \*